(12) United States Patent
Jomaa et al.

(10) Patent No.: US 9,679,841 B2
(45) Date of Patent: Jun. 13, 2017

(54) SUBSTRATE AND METHOD OF FORMING THE SAME

(71) Applicant: QUALCOMM Incorporated, San Diego, CA (US)

(72) Inventors: Houssam Wafic Jomaa, San Diego, CA (US); Omar James Bchir, San Marcos, CA (US); Kuiwon Kang, Seoul (KR); Chin-Kwan Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 298 days.

(21) Appl. No.: 14/276,763

(22) Filed: May 13, 2014

(65) Prior Publication Data
US 2015/0333004 A1    Nov. 19, 2015

(51) Int. Cl.
| H01L 23/535 | (2006.01) |
| H01L 23/522 | (2006.01) |
| H01L 21/768 | (2006.01) |
| H01L 21/48  | (2006.01) |
| H01L 23/538 | (2006.01) |
| H01L 21/683 | (2006.01) |

(52) U.S. Cl.
CPC ...... H01L 23/5226 (2013.01); H01L 21/4857 (2013.01); H01L 21/6835 (2013.01); H01L 21/76877 (2013.01); H01L 21/76895 (2013.01); H01L 23/5383 (2013.01); *H01L 21/486* (2013.01); *H01L 23/5384* (2013.01); *H01L 2221/68345* (2013.01); *H01L 2924/0002* (2013.01)

(58) Field of Classification Search
CPC ............ H01L 23/5226; H01L 23/5383; H01L 21/76877; H01L 21/4857; H01L 21/6835
USPC ....................................................... 257/774
See application file for complete search history.

(56) References Cited

U.S. PATENT DOCUMENTS

| 7,060,595 B2 | 6/2006 | Ou et al. |
| 8,482,118 B2 | 7/2013 | Mohan et al. |
| 8,648,277 B2 | 2/2014 | Alpay et al. |

(Continued)

FOREIGN PATENT DOCUMENTS

EP    1519414 A1    3/2005

OTHER PUBLICATIONS

International Search Report and Written Opinion—PCT/US2015/027806—ISA/EPO—Aug. 10, 2015.

*Primary Examiner* — Trung Q Dang
(74) *Attorney, Agent, or Firm* — Muncy, Geissler, Olds & Lowe, P.C.

(57) ABSTRACT

Methods and apparatus for formation of a semiconductor substrate with photoactive dielectric material, embedded traces, a padless skip via extending through two dielectric layers, and a coreless package are provided. In one embodiment, a method for forming a core having a copper layer; laminating the copper layer a photoactive dielectric layer; forming a plurality of trace patterns in the photoactive dielectric layer; plating the plurality of trace patterns to form a plurality of traces; forming an insulating dielectric layer on the photoactive dielectric layer; forming a via through the insulating dielectric layer and the photoactive dielectric layer; forming additional routing patterns on the insulating dielectric layer; removing the core; and applying a solder mask.

21 Claims, 7 Drawing Sheets

(56) References Cited

U.S. PATENT DOCUMENTS

| | | |
|---|---|---|
| 2004/0056344 A1 | 3/2004 | Ogawa et al. |
| 2008/0169124 A1 | 7/2008 | Zhang |
| 2010/0139964 A1 | 6/2010 | An et al. |
| 2011/0169164 A1* | 7/2011 | Nakamura .......... H01L 21/4857 257/739 |
| 2011/0227214 A1* | 9/2011 | Tateiwa .................. H01L 24/19 257/734 |
| 2011/0272780 A1 | 11/2011 | Smeys et al. |
| 2011/0304016 A1* | 12/2011 | Nakamura .......... H01L 21/4857 257/532 |
| 2013/0119562 A1* | 5/2013 | Shimizu .................. H01L 23/48 257/782 |

* cited by examiner

SUBSTRATE AND METHOD OF FORMING THE SAME

FIELD OF DISCLOSURE

This disclosure relates generally to semiconductors, and more specifically, but not exclusively, to methods for formation of semiconductor package substrates.

BACKGROUND

Conventionally, semiconductor packaging is formed through layer by layer buildup on a central glass reinforced core material, as one option, to enable fine routing and act as a space transformer between the silicon and motherboard. This approach however may not provide sufficient routing density especially in cases where die split and very fine routing between both die are needed. Alternatively, semiconductor packages can be formed through a coreless process in which the first layer is embedded, this will afford finer routing as it eliminates the need for seed layer removal (improve on compensation). These 2 approaches formed through organic substrates are generally trying to compete with silicon interposers and organic interposers that make use of "fab-like" processes—using seed layer sputter, thin liquid resist and forming thin copper routing layer. This provides very fine routing but the cost and the Cu thickness, and consequently electrical resistivity are major drawbacks. Accordingly, there are long-felt industry needs for methods that improve upon conventional methods including the improved methods and apparatus provided hereby.

The inventive features that are characteristic of the teachings, together with further objects and advantages, are better understood from the detailed description and the accompanying figures. Each of the figures is provided for the purpose of illustration and description only, and does not limit the present teachings.

SUMMARY

The following presents a simplified summary relating to one or more aspects and/or embodiments associated with the apparatus and methods disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the apparatus and methods disclosed herein in a simplified form to precede the detailed description presented below.

Some exemplary embodiments of the disclosure are directed to systems, apparatus, and methods for forming a coreless substrate structure having first and second dielectric layers with very fine embedded traces in the first dielectric layer and a landing/capture padless via extending between both first and second dielectric layers.

In some embodiments of the disclosure, the system, apparatus, and method includes forming a core; laminating a top of the core with a photoactive (photoimageable) dielectric layer; forming a plurality of trace patterns in the photoactive dielectric layer; plating the plurality of trace patterns to form a plurality of traces; forming an insulating dielectric layer on the photoactive dielectric layer; forming a via through the insulating dielectric layer and the photoactive dielectric layer; forming additional routing patterns on the insulating dielectric layer; removing the core; and adding a solder mask.

In some embodiments of the disclosure, the system, apparatus and method includes a semiconductor structure with a coreless substrate having a permanent photoactive dielectric layer and an insulating dielectric layer, a plurality of traces embedded in the permanent photoactive dielectric layer, and means for conducting extending through the insulating dielectric layer and the permanent photoimageable dielectric layer.

Other objects and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of embodiments of the disclosure and are provided solely for illustration of the embodiments and not limitation thereof.

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
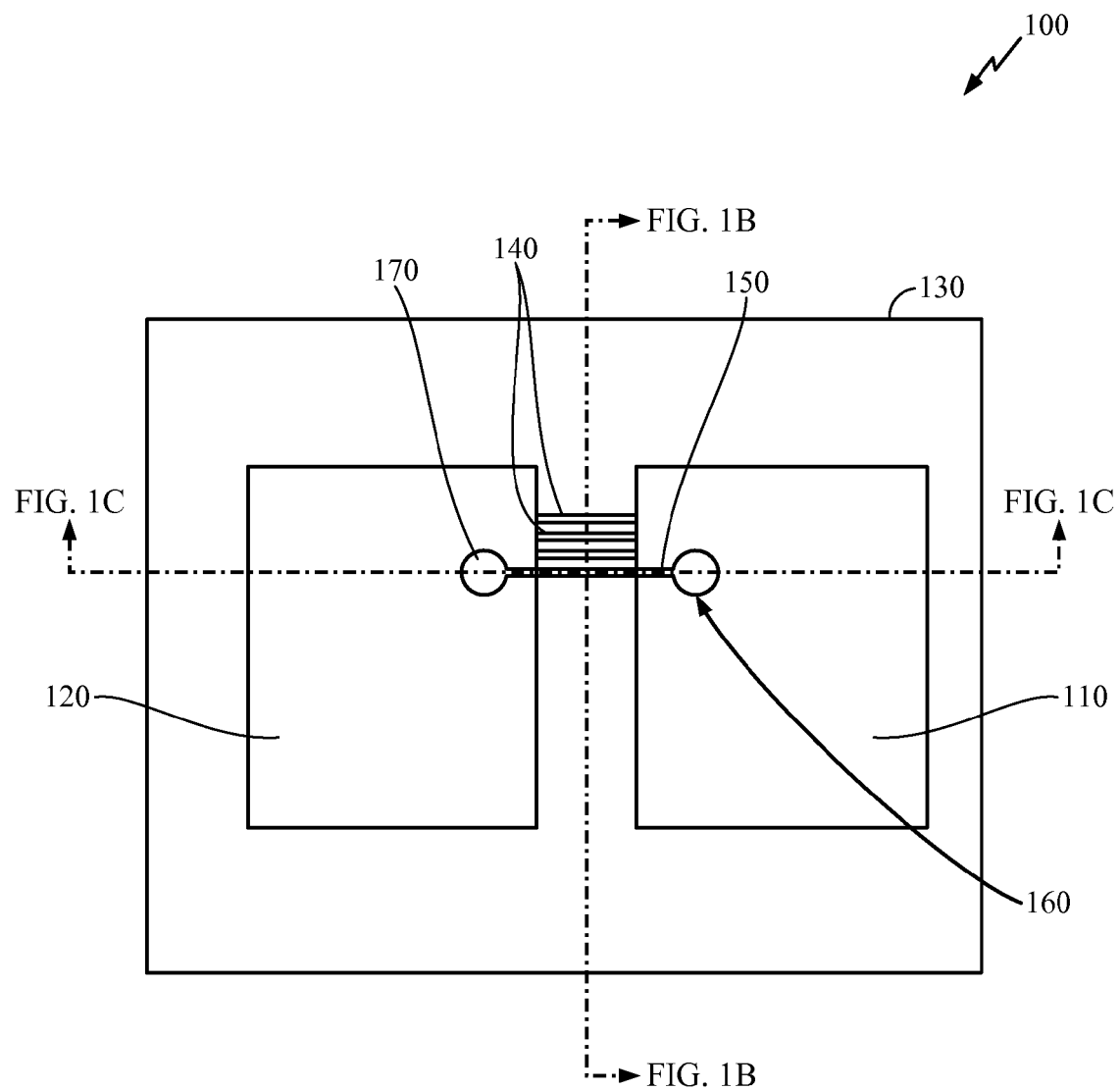
FIG. 1A depicts a top down view of an exemplary substrate in accordance with an embodiment of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Systems, apparatus, and methods for formation of a coreless substrate with an photoactive (photoimageable) dielectric, padless skip via and embedded traces are provided. The exemplary methods disclosed herein advantageously address the long-felt industry needs, as well as other previously unidentified needs, and mitigate shortcomings of the conventional methods. For example, advantages provided by the disclosed embodiments herein are an improvement in cost savings, easier manufacturing, lower height profile, via in a bump pad with smaller profile over conventional devices.

Various aspects are disclosed in the following description and related drawings to show specific examples relating to exemplary embodiments of the disclosure. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

FIG. 1A depicts an exemplary embodiment of a semiconductor package including a coreless substrate with padless vias and a photoimageable dielectric layer having embedded traces. As shown in FIG. 1, a semiconductor package 100 may include two active die 110 and 120 on top of a substrate 130. The substrate 130 may include a plurality of embedded traces 140, a trace connected by via 150 and padless skip vias 160 and 170. The via trace 150 may connect the two active die 110 and 120. The via trace connection may be made by coupling via trace 150 with active die 110 and 120 through padless skip vias 160 and 170.

Figure 1B:
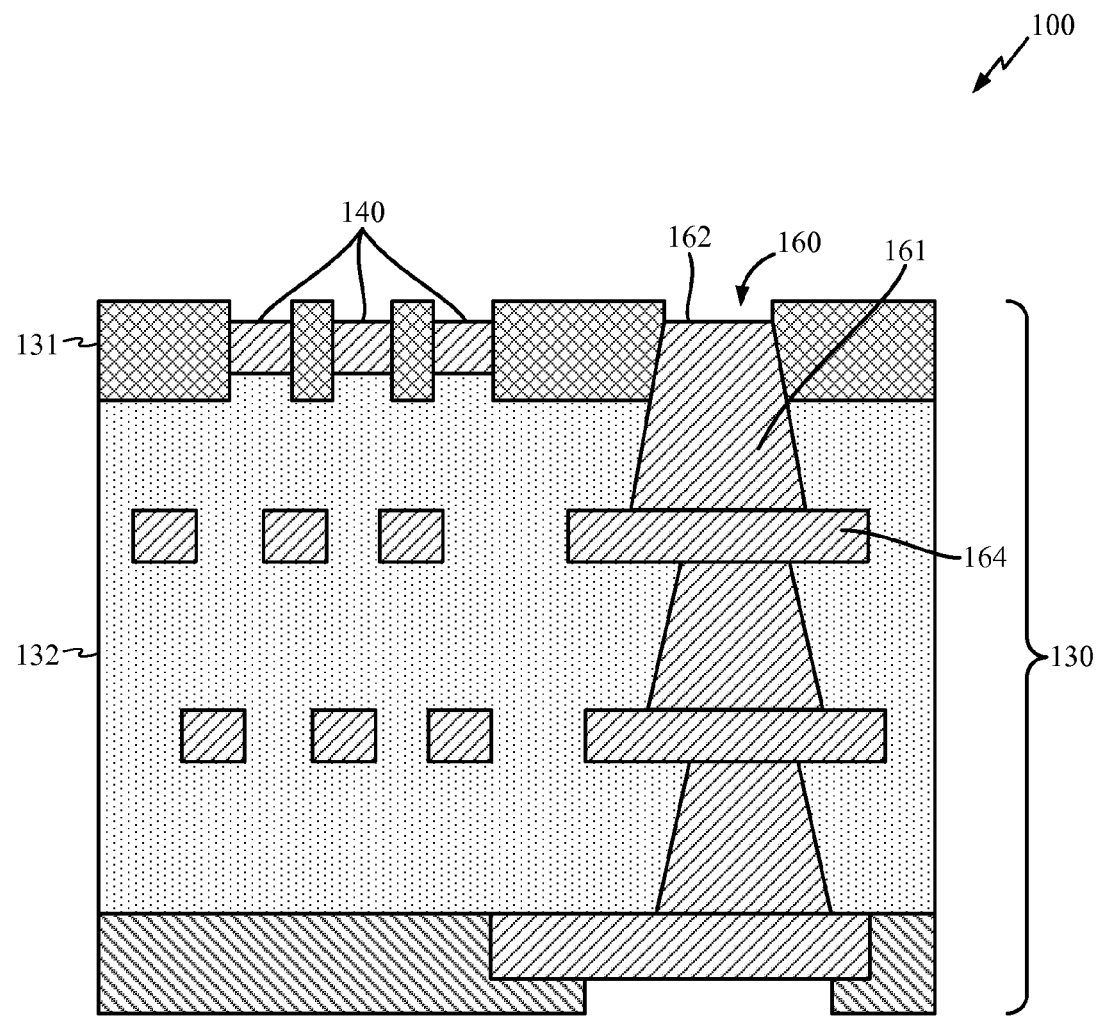
FIGS. 1B and 1C depict side views of the exemplary substrate of FIG. 1A along the cut lines shown.

FIG. 1B depicts a cross section view of the exemplary embodiment shown in FIG. 1A along the indicated cut line. As shown in FIG. 1B, semiconductor package 100 may include a substrate 130 having a first dielectric layer 131, a second dielectric layer 132, a padless skip via 160 and a plurality of traces 140 embedded in the first dielectric layer 131. While the embodiment shown includes multiple vias and second dielectric layer regions, this is optional. The first dielectric layer 131 may be a photoactive material that may be applied as a liquid or a dry film. The second dielectric layer 132 may be a different composition from layer 131 such as a silica based epoxy material. The padless skip via 160 may include a body 161, a bottom portion 162, a top portion 163, and a cover pad 164. The bottom portion 162 may be formed without a landing or capture pad. The top portion 163 may be formed with a cover pad 164.

As shown in FIG. 1B, the embedded traces 140 may be formed of a conductive material such as copper to facilitate signal routing. The traces may be formed with very fine patterning in the dielectric layer 131. The very fine patterning may allow low line and space tracing dimensions less than 5 μm/5 μm such as 2 μm/2 μm. The dielectric layer 131 may be a smaller dimension than the dielectric layer 132. For example, dielectric layer 131 may be approximately 5-10 μm thick while the dielectric layer 132 may be approximately 15 μm thick. The padless skip via 160 may have a top portion 162 smaller than a bottom portion 163. For example, 35 μm diameter for top portion 162 and 40 μm diameter for bottom portion 163. The lack of a capture or landing pad for via 160 may allow for higher routing density dielectric layer 131 for additional routing or traces.

Figure 1C:
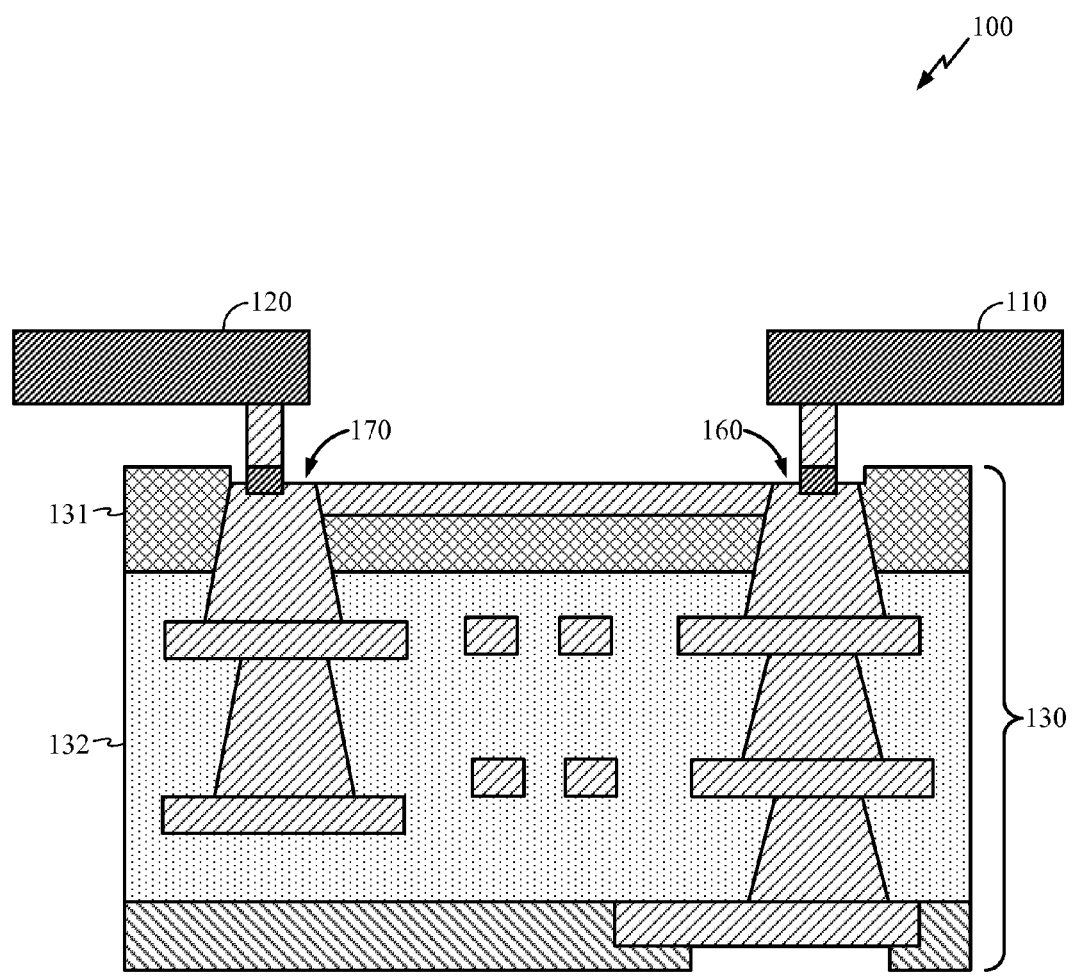

FIG. 1C depicts a cross section view of the exemplary embodiment shown in FIG. 1A along the indicated cut line. As shown in FIG. 1C, semiconductor package 100 may include a first die 110; a second die 120; substrate 130 having a first dielectric layer 131 and a second dielectric layer 132; padless skip vias 160 and 170; and a via trace 150. Via trace or routing 150 may connect vias 160 and 170, which in turn may provide a connection between die 110 and 120.

Figure 2A:
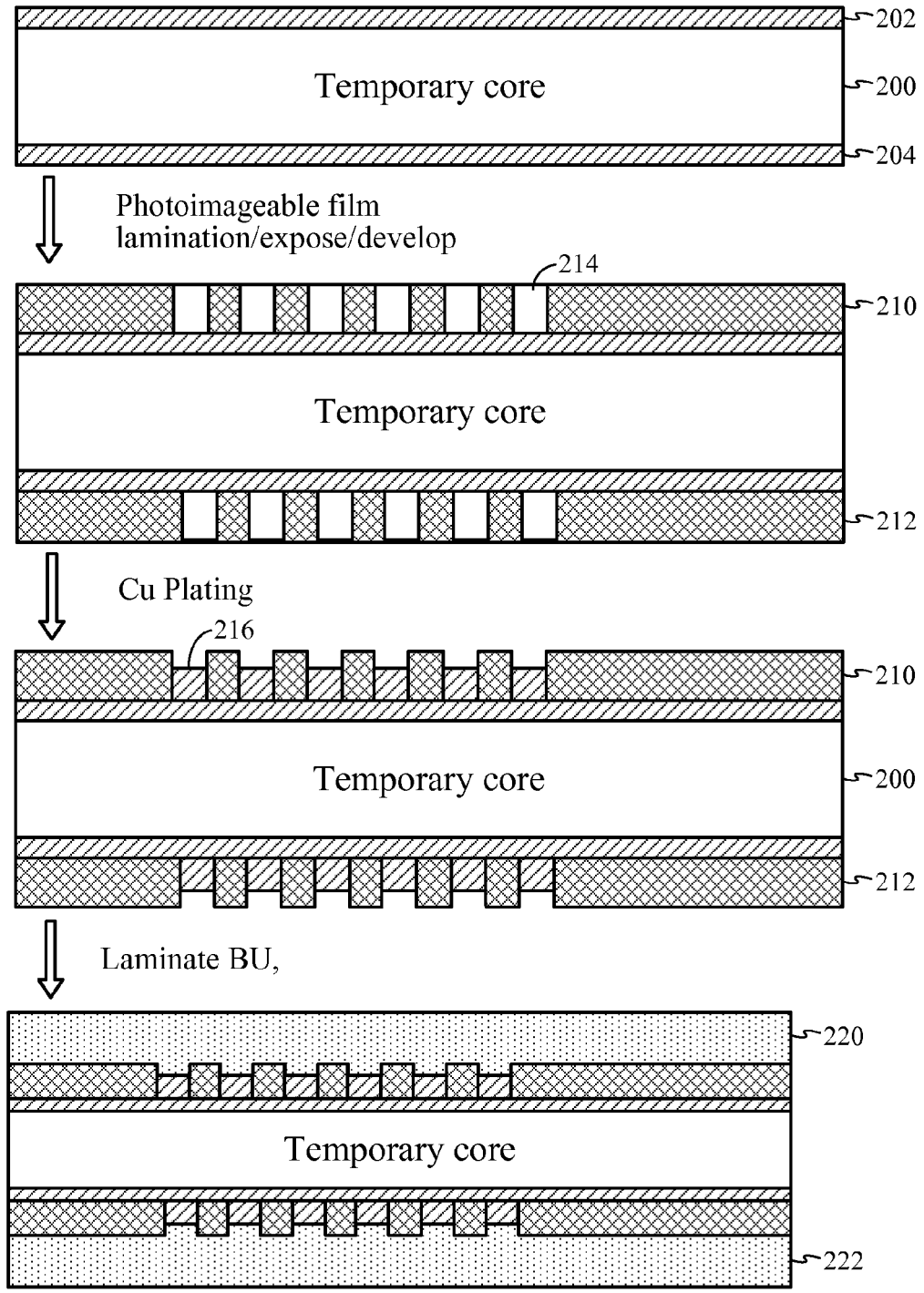
FIG. 2A depicts an exemplary method and apparatus in accordance with an embodiment of the disclosure that shows laminating and plating of a temporary core.

FIG. 2A depicts an exemplary embodiment of a method for formation of a coreless substrate. In FIG. 2A, a temporary core 200 may have a first copper layer 202 and a second copper layer 204. While two copper layers are shown, it should be understood that core 200 may include just one layer and that the layers may be composed of other materials such as conductive metals.

Next, a first dielectric layer 210 is applied to first copper layer 202 and a second dielectric layer 212 is applied to second copper layer 204. The first and second dielectric layers 210 and 212 may be a photoactive liquid or dry photoimageable film. The first and second dielectric layers 210 and 212 may be layered or cured to a thickness of approximately 5-10 µm and may include trace patterns 214. While two layers 210 and 212 are shown, it should be understood that only one layer may be used. The trace patterns 214 may be very fine and have line space dimensions of less than 5/5 µm such as 2/2 µm. The layers 210 and 212 may be exposed to light such as UV light and developed to remove the portions in the trace patterns 214.

After the material in the trace patterns 214 is removed, the core 200 may be subject to a copper plating process that plates copper in the trace pattern 214 voids. As can be seen in FIG. 2A, the plating process may plate copper in only a portion of the trace pattern 214 voids. This may allow the resulting copper traces 216 to have smaller dimensions that the thickness of the photoactive layer. As mentioned above, the plating material can be other than copper. The photoactive layers 210 and 212 may remain after the plating process and may not have to be stripped from the core 200. By avoiding a stripping process, the copper traces conform more readily to the pattern trace since no additional compensation for the trace dimension (trace width) should be done to account for copper seed layer etching or copper roughening steps. This reduces the concern of trace lifting during stripping and etching processes.

Next, a third dielectric layer 220 is applied to the first dielectric layer 210 and a fourth dielectric layer 222 is applied to second dielectric layer 212. The third and fourth dielectric layers 220 and 222 may be a different composition than first and second dielectric layers 210 and 212. The composition of layers 220 and 222 may be a non-photoactive material such as a silica based epoxy material. The third and fourth layers 220 and 222 may be layered or built up to a thickness greater than that of the first and second layers 210 and 212. For example, first and second layers 210 and 212 may be approximately 5-10 µm and the third and fourth layers 220 and 222 may be approximately 15 µm.

Figure 2B:
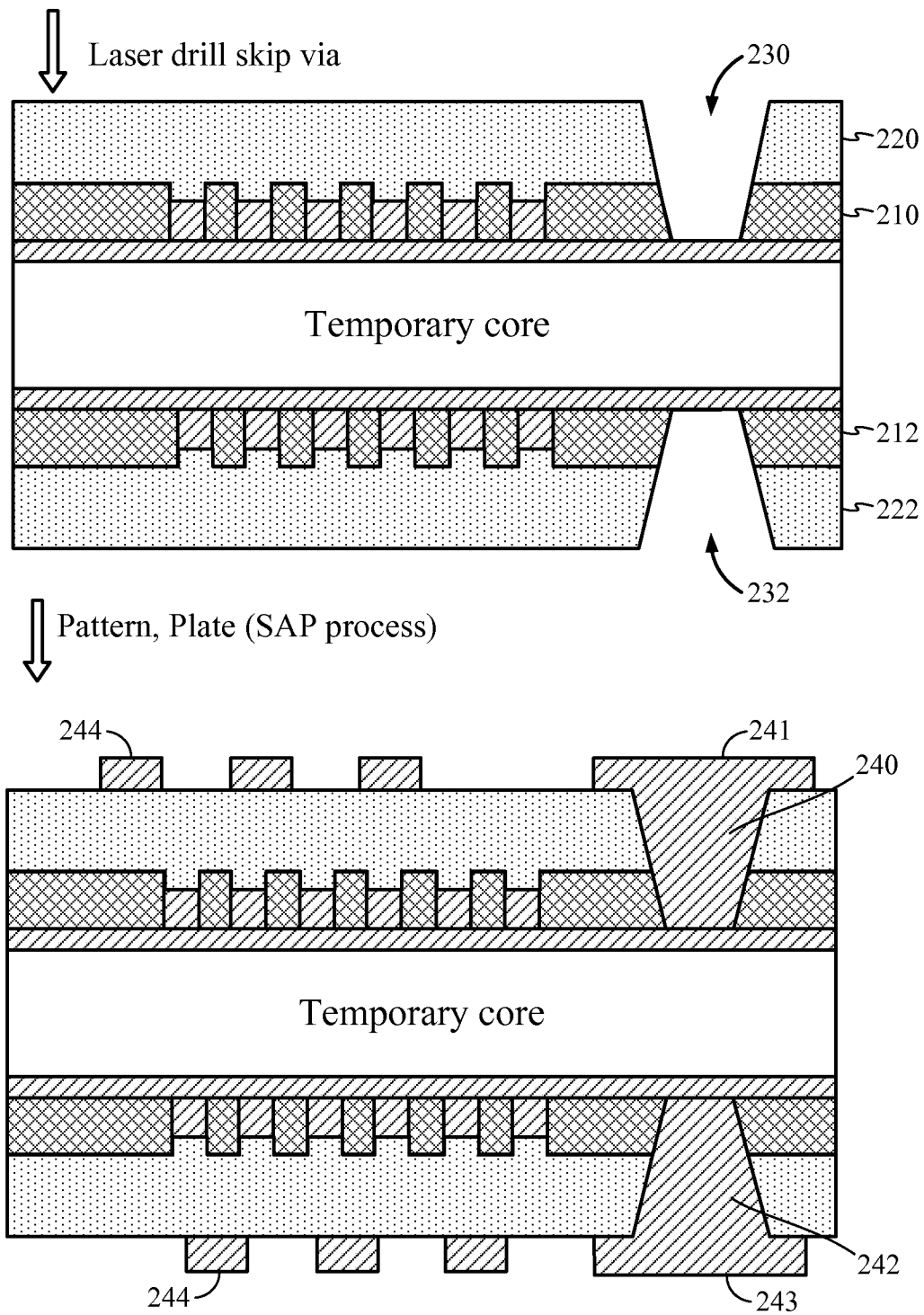
FIG. 2B depicts an exemplary method and apparatus in accordance with an embodiment of the disclosure that shows skip via formation and semi-additive plating process.

FIG. 2B depicts an exemplary embodiment of a method for formation of a coreless substrate. As shown in FIG. 2B, after applying third and fourth dielectric layers 220 and 222, a first via 230 and a second via 232 may be formed. The first and second vias 230 and 232 may be formed by a chemical or mechanical process such as laser drilling or ablation. The first and second vias 230 and 232 may be extended through both dielectric layers 210 and 220 and dielectric layers 212 and 222 respectively. The first and second vias may be extended from an outer edge or side of the third and fourth layers 220 and 222 to first and second copper layers 202 and 204. This may allow the vias 230 and 232 to be formed without landing or capture pads, which will save horizontal space for finer or additional routing and traces. Next, a semi-additive process (SAP) including a copper plating process is applied to form a first padless skip via 240 with a cover pad 241 and a second padless via 242 with a cover pad 243 as well as bottom traces 244.

Figure 3A:
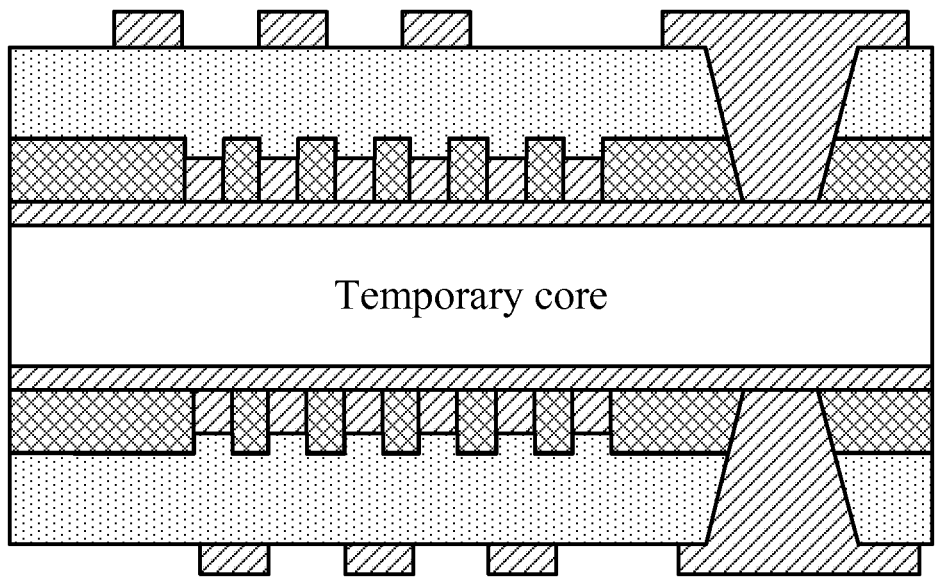
FIG. 3A depicts an exemplary method and apparatus in accordance with an embodiment of the disclosure that shows SR lamination, exposure, and development.
Figure 3A:
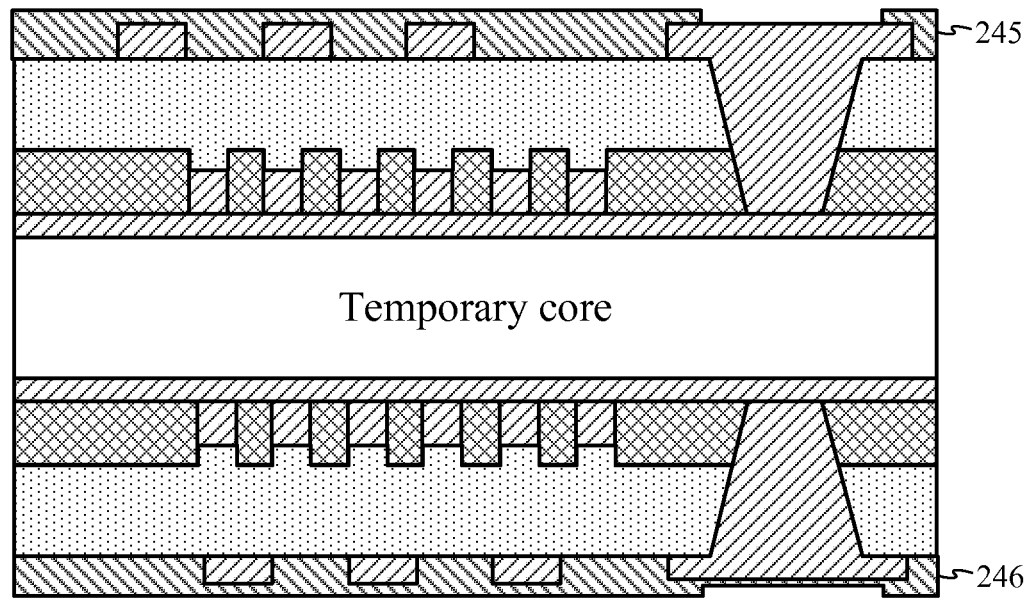
Figure 3B:
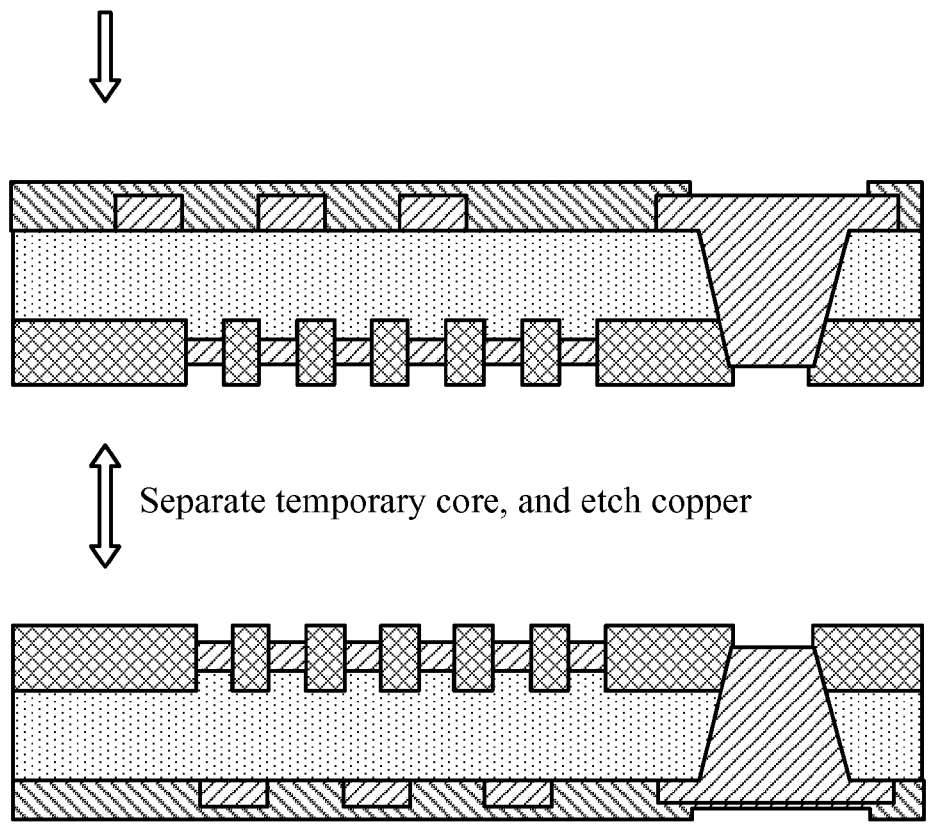
FIG. 3B depicts an exemplary method and apparatus in accordance with an embodiment of the disclosure that shows separation of the temporary core and copper etching.

FIGS. 3A and 3B depict an exemplary embodiment of a method for formation of a coreless substrate. In FIG. 3A, the process illustrated in FIG. 2B is continued. As shown in FIG. 3A, additional vias may be formed by adding additional dielectric layers on top of the third and fourth dielectric layers 220 and 222. These additional dielectric layers may then go through the processes depicted in FIG. 2B to form additional vias and via traces. The additional vias may be formed by a chemical or mechanical process that extends the via from an outer surface of the added dielectric layer to the cover pad of the previously formed vias. As depicted in FIG. 3A, if no additional dielectric layers and associated vias are desired, the structure may be subject to a SR process that laminates, exposes and develops SR layers 245 and 246 covering via traces 244 and portions of cover pads 241 and 243. As shown in FIG. 3B, the temporary core 200 and copper layers 202 and 204 are removed. The core 200 may be separate by a mechanical process and the copper layers 202 and 204 may be etched away after separation.

In another embodiment of the invention, the semiconductor structure may include a coreless substrate having a permanent photoactive dielectric layer and an insulating dielectric layer, a plurality of traces embedded in the permanent photoactive dielectric layer, and means for conducting extending through the insulating dielectric layer and the permanent photoimageable dielectric layer. The means for conducting provides a path or way to conduct electrical signals (provide an electrical connection) between layers in the semiconductor structure that goes through the plane of one or more adjacent layers. The means for conducting may be a via (vertical interconnect access) that provides an opening in one layer for conducting electrical signals between layers. The means for conducting may consist of two pads in corresponding positions on different layers of the semiconductor structure that are electrically connected by a hole through the structure. The hole may be made conductive by electroplating, lining the hole with conductive material, filling the hole with conductive material, or with a tube or a rivet. The means for conducting may be a skip via, microvia, through hole via, through silicon via, blind via, or buried via. The means for conducting may include a barrel or conductive tube filling the hole, an antipad or clearance hole between the barrel and a no-connect metal layer, and may optionally include a pad that connects each end of the barrel to a component, plane or trace.

It should be understood that although the description above mentions copper, substitute materials can be used in place of copper. The substitute materials can include a mechanical structure that resists etching or a structure that can be coated to resist etching.

Embodiments of the methods described herein can be used in a number of applications and integrated circuits. For example, the described embodiments may be used in a dual die (die partitioning) high density routing between both die to insure proper communication. The described embodiments may be used without the use of silicon or organic interposer, which may reduce the cost of fabrication. The described embodiments may be used for processors, memory, or power management devices in high density routing application. Further applications should be readily apparent to those of ordinary skill in the art.

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some exemplary embodiments, some or a plurality of the most important method steps can be performed by such an apparatus.

The exemplary embodiments described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the exemplary embodiments herein.

In the detailed description above it can be seen that different features are grouped together in exemplary embodiments. This manner of disclosure should not be understood as an intention that the claimed exemplary embodiments require more features than are explicitly mentioned in the respective claim. Rather, the situation is such that inventive content may reside in fewer than all features of an individual exemplary embodiment disclosed. Therefore, the following claims should hereby be deemed to be incorporated in the description, wherein each claim by itself can stand as a separate exemplary embodiment. Although each claim by itself can stand as a separate exemplary embodiment, it should be noted that—although a dependent claim can refer in the claims to a specific combination with one or a plurality of claims—other exemplary embodiments can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some exemplary embodiments, an individual step/action can be subdivided into a plurality of sub-steps or contain a plurality of sub-steps. Such sub-steps can be contained in the disclosure of the individual step and be part of the disclosure of the individual step.

Accordingly, an embodiment of the disclosure can include a computer readable media embodying a method for location estimation. Accordingly, the disclosure is not limited to illustrated examples and any means for performing the functionality described herein are included in embodiments of the disclosure.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A substrate prepared by a process comprising:
    laminating a photoactive dielectric layer directly on a copper layer of a core material;
    forming a plurality of trace patterns in the photoactive dielectric layer;
    plating the plurality of trace patterns to form a plurality of traces embedded in the photoactive dielectric layer;
    forming an insulating dielectric layer on the photoactive dielectric layer after plating the plurality of trace patterns, the insulating dielectric layer covering the plurality of traces and comprising a non-photoactive dielectric layer;
    forming a via through the insulating dielectric layer and the photoactive dielectric layer;
    forming additional routing patterns on the insulating dielectric layer;
    removing the core material; and
    applying a solder mask.

2. The product of the process of claim 1, wherein each of the plurality of traces has a width of 5 μm and a gap of 5 μm between each of the plurality of traces.

3. The product of the process of claim 1, wherein each of the plurality of traces has a width of 2 μm and a gap of 2 μm between each of the plurality of traces.

4. The product of the process of claim 1, wherein the via is a skip via.

5. The product of the process of claim 1, wherein the via is a padless skip via.

6. The product of the process of claim 1, wherein the photoactive dielectric layer is less than 10 μm.

7. The product of the process of claim 1, wherein the photoactive dielectric layer is approximately 5 μm.

8. The product of the process of claim 1, wherein the insulating dielectric layer is approximately 15 μm.

9. The product of the process of claim 1, wherein the via has a top portion smaller than a bottom portion.

10. A semiconductor structure comprising:
    a coreless substrate, the coreless substrate comprises a permanent photoactive dielectric layer and an insulating dielectric layer on the permanent photoactive dielectric layer;
    a plurality of traces embedded in the permanent photoactive dielectric layer, wherein the insulating dielectric layer covers the plurality of traces and comprises a different material than the photoactive dielectric layer;
    a first via that extends through the insulating dielectric layer and the permanent photoimageable dielectric layer;
    a second via, proximate to the first via, that extends through the insulating dielectric layer and the permanent photoimageable dielectric layer; and a via trace embedded in a solder resist laminate layer on the insulating dielectric layer, the via trace configured to connect the first via and the second via.

11. The semiconductor structure of claim 10, wherein each of the plurality of traces has a width of 5 µm and a gap of 5 µm between each of the plurality of traces.

12. The semiconductor structure of claim 10, wherein each of the plurality of traces has a width of 2 µm and a gap of 2 µm between each of the plurality of traces.

13. The semiconductor structure of claim 10, wherein the via is a skip via.

14. The semiconductor structure of claim 10, wherein the via is a padless skip via.

15. The semiconductor structure of claim 10, wherein the photoactive dielectric layer is less than 10 µm.

16. The semiconductor structure of claim 10, wherein the photoactive dielectric layer is approximately 5 µm.

17. The semiconductor structure of claim 10, wherein the insulating dielectric layer is approximately 15 µm.

18. The semiconductor structure of claim 10, wherein the insulating dielectric layer is a non-photoactive dielectric layer.

19. A semiconductor structure, comprising:
a coreless substrate, the coreless substrate comprises a permanent photoactive dielectric layer and an insulating dielectric layer;
a plurality of traces embedded in the permanent photoactive dielectric layer, wherein the insulating dielectric layer covers the plurality of traces and comprises a different material than the photoactive dielectric layer;
first means for conducting, the first means for conducting extends through the insulating dielectric layer and the permanent photoimageable dielectric layer;
second means for conducting, proximate to the first means for conducting, that extends through the insulating dielectric layer and the permanent photoimageable dielectric layer; and
a via trace embedded in a solder resist laminate layer on the insulating dielectric layer, the via trace configured to connect the first means for conducting and the second means for conducting.

20. The semiconductor structure of claim 19, wherein each of the plurality of traces has a width of 5 µm and a gap of 5 µbetween each of the plurality of traces.

21. The semiconductor structure of claim 19, wherein each of the plurality of traces has a width of 2 µm and a gap of 2 µm between each of the plurality of traces.

* * * * *